United States Patent [19]

Feist

[11] 4,402,761
[45] Sep. 6, 1983

[54] METHOD OF MAKING SELF-ALIGNED GATE MOS DEVICE HAVING SMALL CHANNEL LENGTHS

[75] Inventor: Wolfgang M. Feist, Burlington, Mass.

[73] Assignee: Raytheon Company, Lexington, Mass.

[21] Appl. No.: 342,861

[22] Filed: Jan. 26, 1982

Related U.S. Application Data

[63] Continuation of Ser. No. 969,906, Dec. 15, 1978, abandoned.

[51] Int. Cl.³ .................. H01L 21/302; H01L 21/26; H01L 29/78
[52] U.S. Cl. ........................................ 148/1.5; 29/571; 29/576 B; 29/578; 148/187; 357/91
[58] Field of Search ............... 148/1.5, 187; 29/571, 29/576 B, 578; 357/91

[56] References Cited

U.S. PATENT DOCUMENTS

| | | | |
|---|---|---|---|
| 4,069,067 | 1/1978 | Ichinohe | 148/1.5 |
| 4,209,349 | 6/1980 | Ho et al. | 148/1.5 |
| 4,214,359 | 7/1980 | Kahng | 29/571 |
| 4,258,465 | 3/1981 | Yasui et al. | 29/571 |
| 4,282,646 | 8/1981 | Fortino et al. | 29/571 |
| 4,305,201 | 12/1981 | Tiefert | 29/576 B |

FOREIGN PATENT DOCUMENTS

| | | |
|---|---|---|
| 1200091 | 7/1970 | United Kingdom . |
| 1221882 | 2/1971 | United Kingdom . |
| 1327423 | 8/1973 | United Kingdom . |
| 1446268 | 8/1976 | United Kingdom . |
| 1510683 | 5/1978 | United Kingdom . |

OTHER PUBLICATIONS

Bassous et al., IBM-TDB, Apr. 1980: 22(11), p. 5146.

*Primary Examiner*—Upendra Roy
*Attorney, Agent, or Firm*—Richard M. Sharkansky; Philip J. McFarland; Joseph D. Pannone

[57] ABSTRACT

A semiconductor structure wherein a masking layer is formed to cover a portion of a surface of a semiconductor. A first doped region is formed in a portion of the semiconductor exposed by the masking layer. A chemical etchant is brought into contact with the masking layer, reducing the area of the masking layer covering the semiconductor exposing a second, different portion of the semiconductor contiguous to the first exposed portion of the semicoductor. Particles capable of establishing a doped region in the semiconductor layer are introduced into the second, different exposed portion of the semiconductor to form a second doped region in the semiconductor contiguous to the first doped region, such chemically etched masking layer inhibiting such particles from becoming introduced into the portion of the semiconductor disposed beneath the chemically etched masking layer. With such methods a self-aligned gate region may be formed in a field effect device having small channel lengths.

7 Claims, 10 Drawing Figures

METHOD OF MAKING SELF-ALIGNED GATE MOS DEVICE HAVING SMALL CHANNEL LENGTHS

This is a continuation of application Ser. No. 969,906, filed Dec. 15, 1978, now abandoned.

BACKGROUND OF THE INVENTION

This invention relates generally to semiconductor structures and manufacturing methods and more particularly to short channel metal-oxide-semiconductor (MOS) field-effect transistor structures and manufacturing methods.

As is known in the art, high performance MOS field-effect transistors generally require channel lengths below 3 $\mu$m and even as short as 0.5 to 1.0 $\mu$m. It is very difficult to obtain these small dimensions with present photolithographic techniques. This difficulty has led to the development of several types of transistors having channel lengths defined by means other than photolithography. One such device is generally referred to as a D-MOS transistor where two diffusions of dopants of opposite type conductivity are driven to different depths in a silicon substrate through one, noncritical mask opening, resulting in a channel length equal to the difference in the depth of the electrical junctions formed. Here, however, since the doping concentration varies along the channel, the "turn-on" voltage, which is a function of doping, is critically dependent on the location in the channel and the concentration at which the two diffusion profiles intersect. In practice, therefore, the "turn-on", or threshold voltage, will exhibit relatively large fluctuations because of the difficulty to control the two diffusions.

Other types of transistors wherein channel width is controlled by means other than photolithography are so-called "V-MOS" transistors and "D-V-MOS" transistors. With a V-MOS transistor the channel length is generally defined by the up-diffusion of boron from an n-type substrate into a p-type epitaxial layer formed on such substrate, in combination with a V-shaped groove etched through the epitaxial layer, down into the substrate. In the D-V-MOS transistor the channel is generally defined by an implant of boron from the top surface, through the n+ layer forming the source and drain, and again the intersection of the implanted zone with the walls of a V-shaped groove.

SUMMARY OF THE INVENTION

In accordance with the present invention a masking layer is formed to cover a portion of a surface of a semiconductor; a first doped region is formed in a portion of the semiconductor exposed by the masking layer; a chemical etchant is brought into contact with the masking layer, reducing the area of the masking layer covering the semiconductor, exposing a second, different portion of the semiconductor contiguous to the first exposed portion of the semiconductor; and particles capable of establishing a doped region in the semiconductor are introduced into the second exposed portion of the semiconductor to form a second doped region in the semiconductor contiguous to the first doped region, such chemically etched masking layer inhibiting such particles from becoming introduced into the portion of the semiconductor disposed beneath the chemically etched masking layer.

In a preferred embodiment of this invention a second masking layer is formed over the first-mentioned masking layer, such second masking layer remaining over the first-mentioned masking layer while a portion of the first-mentioned layer is chemically removed. The second masking layer restricts the chemical attack of the etchant to the side of the first-mentioned masking layer.

Further, the structure is formed in a mesa-shape with side walls of such struture being oxidized for device isolation. The first-mentioned masking layer is silicon dioxide and the second masking layer is silicon nitride. During the oxidation process the second masking layer remains over the first-mentioned masking layer, enabling the selective oxidation of the walls of the silicon semiconductor, but preventing oxidation of the first-mentioned masking layer.

Still further, in a preferred embodiment of this invention the masking layer is used to form source and drain regions of a field effect device. The particles are ion implanted to form a gate region contiguous to one of the source and drain regions. The channel length of this gate region is accurately controlled by the chemical etching process. The masking layer used to form the source and drain regions is, after being chemically etched, used as an ion implantation mask for forming the gate region. In this way the process is self-aligning since the mask used to form the source and drain regions is, after being etched, used to form the gate region. The masking layer includes a layer of silicon dioxide. A drift channel is formed in the silicon layer disposed beneath the silicon dioxide masking layer to electrically connect the ion implanted gate region to the source and drain regions.

With such techniques the field effect device has a uniformly doped short channel formed by ion implantation. Furthermore, the channel length depends on an accurately controlled chemical etching process. Still further, a relatively thick oxide or insulator layer is formed over the drift region so that when a gate electrode is formed over this oxide layer, any parasitic capacitance between such electrode and the drift region is reduced by this thick oxide layer.

BRIEF DESCRIPTION OF THE DRAWINGS

The foregoing features of this invention, as well as the invention itself, may be more fully understood from the following description read together with the accompanying drawings, in which.

DESCRIPTION OF THE PREFERRED EMBODIMENTS

Figure 1:
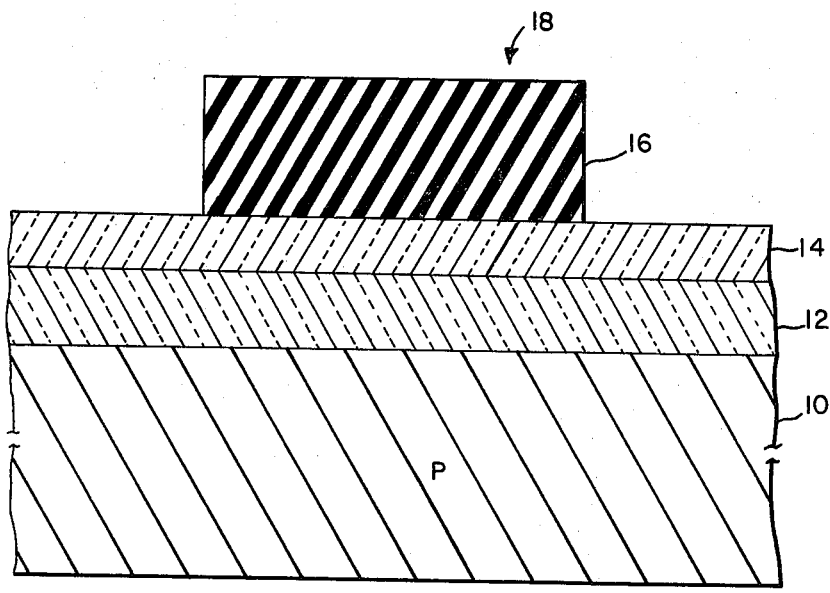
FIGS. 1-9 are cross-section elevation, diagrammatical views of a portion of a field effect device according to the invention at various steps in the manufacture thereof.
Figure 2:
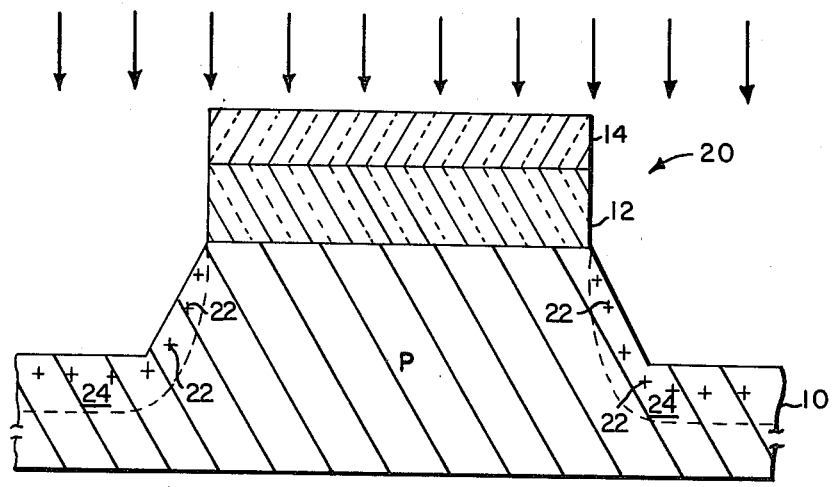

Referring now to FIGS. 1-9, the fabrication of a field effect device will be described. As shown in FIG. 1, a p-type silicon substrate 10, preferably having a surface parallel to the <100> crystallographic plane and having a doping concentration in the range of $5 \times 10^{14}$ to $10^{15}$ atoms per cm$^3$ is coated with a 1500 to 3000 Å thick silicon dioxide layer 12 by conventional thermal oxidation or chemical vapor deposition, or a combination of both. Next the silicon dioxide layer 12 is coated with a silicon nitride layer 14, here in the order of 1500 Å thick, using conventional chemical vapor deposition. A photoresist layer 16 is formed over the silicon nitride layer 14 and selectively removed using conventional photolithography to form a mask 18, as shown. The photoresist mask 18 is used to remove exposed portions of the silicon nitride layer 14 and the then exposed silicon dioxide layer 12 adjacent such mask 18 using any conventional technique. For example, the exposed portions of the silicon nitride layer 14 may be removed using conventional plasma etching and the then exposed portions of the silicon dioxide layer 12 are removed with a suitable chemical etchant, here a hydrofluoric acid solution or also by plasma etching. That is, as will become apparent hereinafter, the composite silicon dioxide layer 12 and silicon nitride layer 14 are etched away from the field or isolation region while they are retained over the mesa shaped region shown in FIG. 2. The remaining portions of the composite silicon dioxide layer 12-silicon nitride layer 14 form an etch resistant mask 20, as shown. The portions of the silicon substrate 10 exposed by such mask 20 are brought into contact by a suitable etchant, either an isotropic or anisotropic etchant, to etch such exposed portions of the silicon substrate 10 to a depth in the order of 3000 to 4000 Å, as shown. The surface of the structure thus formed is exposed to ion implanted particles 22, here boron atoms, with a dosage of $5 \times 10^{13}$ atoms per cm$^2$ to $5 \times 10^{14}$ atoms/cm$^2$ at an implant energy here in the order of 40 Kev. The structure is then heated in a conventional manner to anneal any implant damage and to activate the implanted boron atoms forming p-type conductivity regions 24, as shown.

Figure 3:
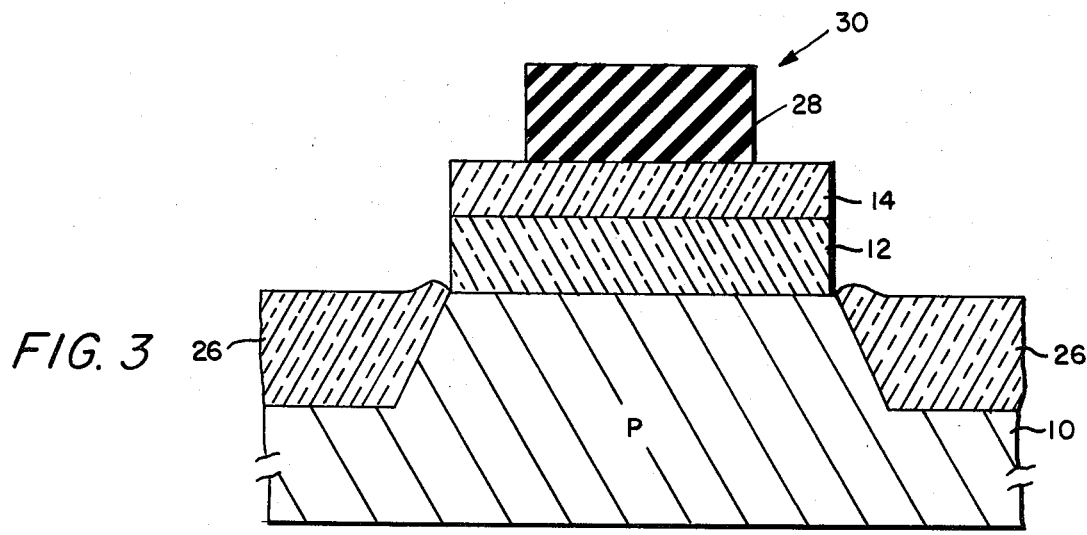

Referring now also to FIG. 3, the structure is then oxidized to form a 6000–8000 Å thick silicon dioxide layer 26 on the side walls of the mesa-shaped silicon substrate 10 and thereby form a surface in the isolation regions which is substantially co-planar with the device surface. (It should be noted that during the oxidation the boron dopant is driven further into the silicon substrate 10.) The boron implant, i.e. p-type conductivity regions 24 (FIG. 2), prevents the formation of an inversion layer on the surface of the high resistivity silicon substrate 10 which would destroy device isolation.

Figure 4:
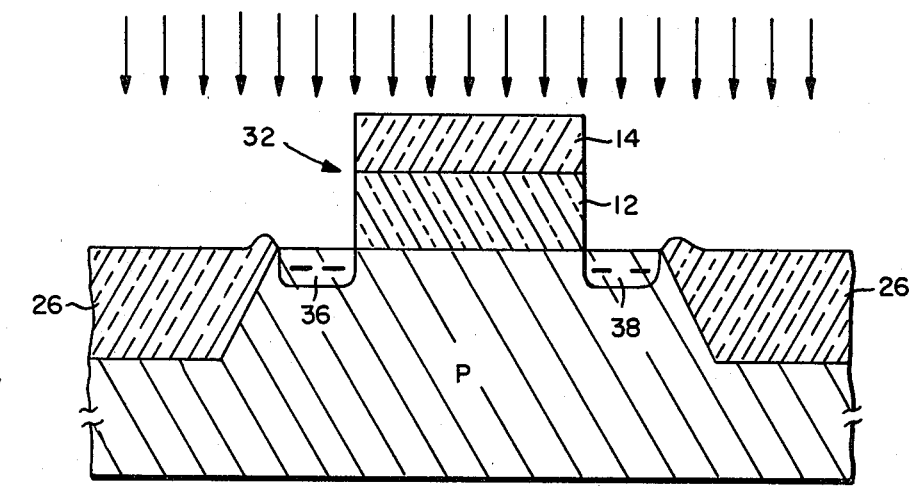

A photoresist layer 28 is deposited over the surface of the structure and then suitably masked and etched, using conventional photolithographic-chemical etching techniques to form a mask 30, as shown in FIG. 3. The portions of the silicon nitride layer 14 and silicon dioxide layer 12 exposed by the photoresist mask 30 are removed in any conventional manner, similar to that described in connection with FIGS. 1 and 2, to expose portions of the underlying surface of the silicon substrate 10, wherein the source and drain regions 36, 38 of the device will be formed, as shown in FIG. 4. The remaining portions of the composite silicon nitride layer 14 and silicon dioxide layer 12 form an ion implantation mask 32 as shown in FIG. 4. Particles, here arsenic atoms, are ion implanted into the portions of the silicon substrate 10 exposed by the ion implantation mask 32. Here a dosage of $5 \times 10^{14}$ atoms/cm$^2$ and an implant energy level of 140 Kev is used. The structure is heated to anneal any implant damage and to activate the implanted arsenic atoms to form n-type conductivity source and drain regions 36, 38 respectively, as shown, in the regions of the silicon substrate 10 which are adjacent the region of such substrate 10 covered by the ion implantation mask 32. The depth of the source and drain regions 36, 38 is here in the order of 1000 Å.

Figure 5:
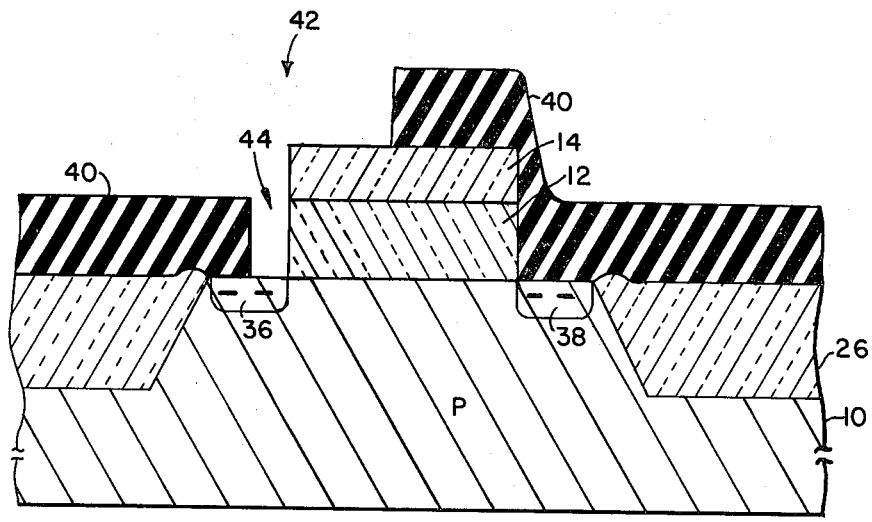
Figure 6:
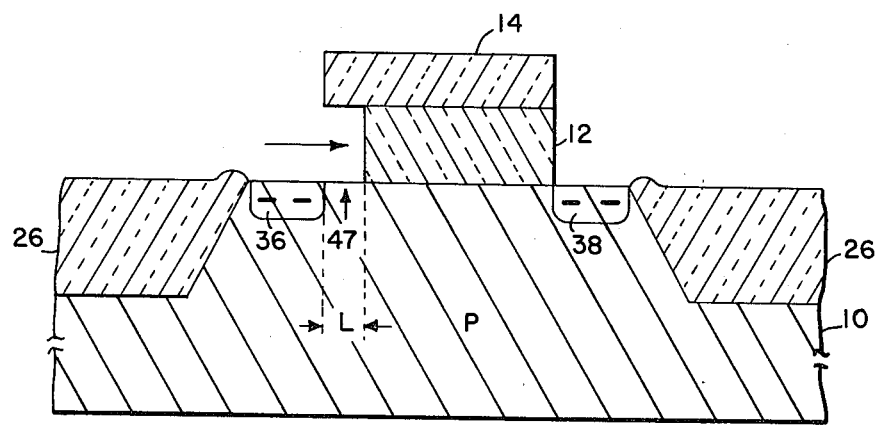

Referring now also to FIG. 5, a photoresist layer 40 is formed over the surface of the structure, using conventional photolithographic techniques to form an etch resistant mask 42 as shown. It is noted that a window 44 is formed in the photoresist layer 40 to expose: A portion of the silicon substrate 10 having the source region 36 formed therein; the side portions of the silicon nitride layer 12; the side portions of the silicon dioxide layer 14 adjacent the source region 36; and a portion of the upper surface of the silicon nitride layer 14. The purpose of the mask 42 is to expose only the edge of the source region 36 while covering the drain region 38. This masking step is then relatively noncritical. A chemical etchant, here a hydrofluoric acid solution, which selectively etches silicon dioxide without attacking either silicon, silicon nitride or photoresist, is brought into contact with the surface of the structure. The chemical etchant passes through the window 44 to attack the exposed side portions of the silicon dioxide layer 12 and thereby selectively etch away and remove such exposed portion of the silicon dioxide layer 12. The chemical etchant therefore reduces the area of the silicon substrate 10 disposed beneath the chemically etched silicon dioxide layer 12, exposing a gate region 47 (FIG. 6) which is contiguous to the source region 36. As will be described, the remaining portion of the silicon dioxide layer 12 will provide an ion implantation mask for forming gate region 47 of the field effect device. The silicon dioxide layer 14 is therefore etched back a length L, here in the order of 0.5 to 2.5 μm, such length, L, being the channel length of the field effect device. It is noted that the length L of the gate region is determined by the amount of chemical etching provided to the silicon dioxide layer 12. This chemical etching process is readily controllable by the etching time duration and chemical etchant strength which is itself controllable by proper dilution. Further, the etching processes may be monitored using a high powered measuring microscope. The resulting structure, after photoresist layer 40 is removed, is shown in FIG. 6.

Figure 7:
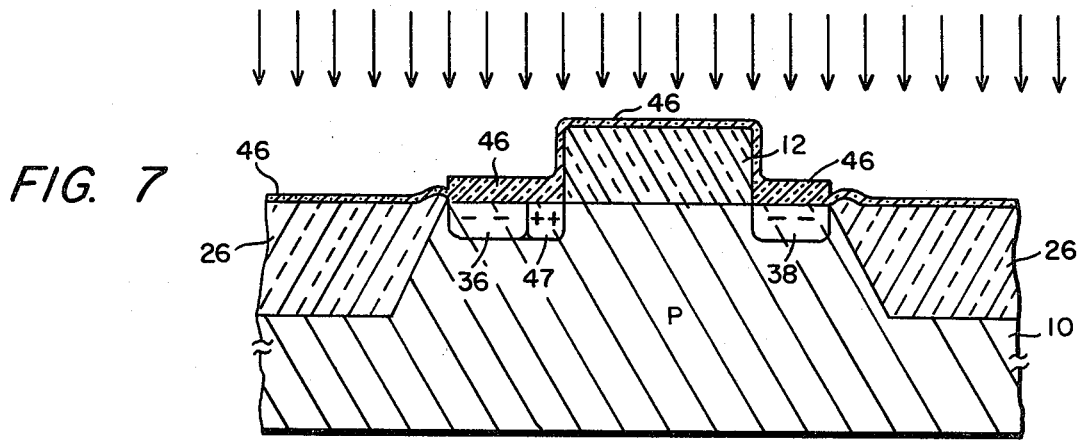

Referring now also to FIG. 7, the silicon nitride layer 14 is removed in any conventional manner and a thin silicon dioxide layer 46 is thermally grown over the surface of the structure. The thin silicon dioxide layer 46 is here in the order of 300 to 1000 Å thick and, as will be shown, provides the gate oxide for the device. (It is noted that the silicon dioxide layer 46 is thicker over the surface of the silicon substrate 10 than over the silicon dioxide layer 14.) Following this thermal oxidation, particles, here boron atoms, are ion implanted into the surface of the structure. It is noted that the thicker silicon dioxide layer 12 serves as an ion implantation mask so that the boron atoms become implanted only into the portion of the silicon substrate 10 which is disposed beneath the thinner oxide layer 46, the silicon dioxide layer 12 inhibiting boron atoms from becoming implanted in the portions of the silicon substrate 10 disposed beneath the silicon dioxide layer 12. The concentration of boron atoms in the silicon substrate 10 is here in the order of $3 \times 10^{12}$ atoms/cm$^2$ and hence, after annealing, a p-type conductivity region is formed in the gate region 47 as shown in FIG. 7. It is noted that the concentration of n-type dopant in the source and drain regions 36, 38 is in the order of $3 \times 10^{19}$ atoms/cm$^3$ or higher and hence is not substantially affected by the boron implant which results in a concentration several orders of magnitude less than $3 \times 10^{19}$ atoms/cm$^3$.

Figure 8:
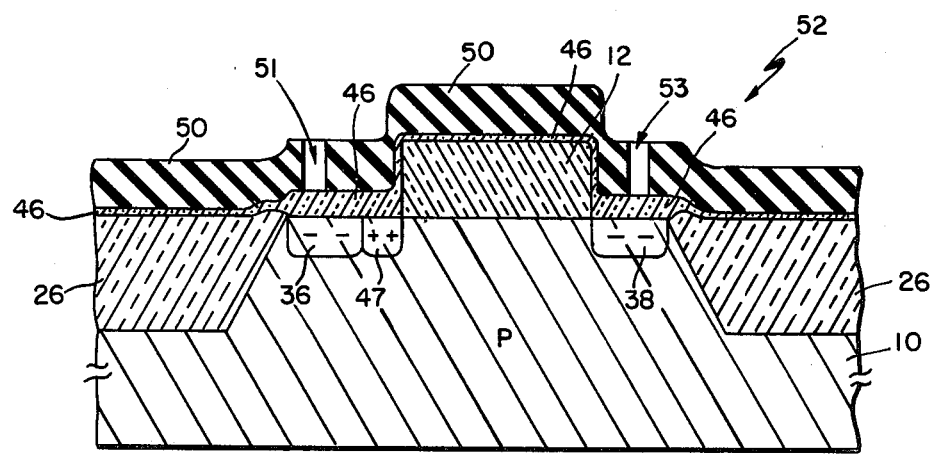
Figure 9:
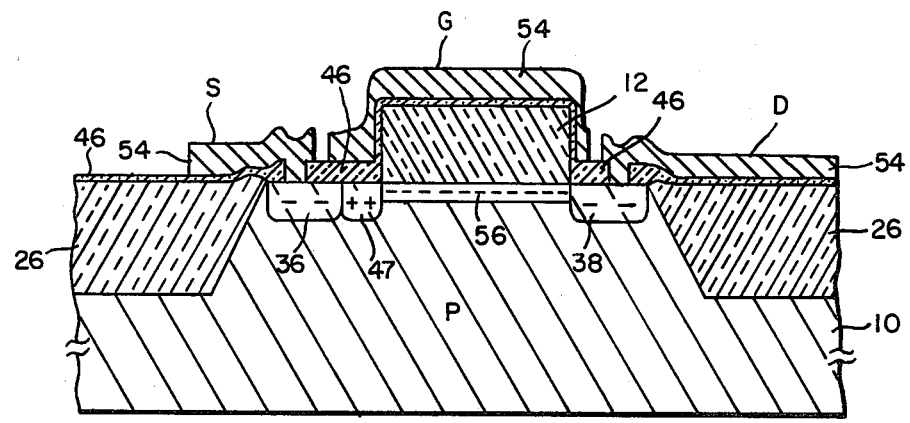

Referring now also to FIG. 8, a photoresist layer 50 is deposited over the surface of the structure and patterned into a source/drain contact mask 52, as shown, using conventional photolithographic-chemical etching techniques. A suitable chemical etchant is then brought into contact with the mask 52 and the portions of the silicon dioxide layer 46 exposed by the windows 51, 53 formed in the mask 52 to selectively remove such exposed portions of the silicon dioxide layer 46 which are disposed over portions of the source and drain regions 36, 38, respectively, as shown in FIG. 9. After the photoresist layer 50 has been removed in any conventional manner a suitable metalization layer 54 is deposited over the surface of the structure, i.e. over the remaining portions of the silicon dioxide layer 46 and, through the windows 51, 53 formed therein, onto the exposed surfaces of the silicon substrate 10 which are disposed over portions of the source and drain regions 36, 38 to form ohmic contact with such regions 36, 38. The metalization layer 54 is then patterned, in any conventional manner, as by photolithographic-chemical etching processing, into source, drain and gate electrodes S, D and G, respectively, as shown in FIG. 9. It should be noted that although the gate electrode G overlaps the source region 36 and the drain region 38 as well as the gate region 47 and a drift region 56, the gate electrode G is separated from the drift region 56 by a thick insulating layer of silicon dioxide, i.e. layer 12, which is in the order of 1500 Å to 3000 Å thick.

In the MOS field effect device thus formed, and shown in FIG. 9, the drift region 56 which is disposed beneath the thick silicon dioxide layer 12 connects the gate region 47 to the drain region 38. The drift region 56 is an n-type conductive region formed at the surface of the silicon substrate 10 adjacent the silicon dioxide layer 12 because of fixed positive charge, generally referred to as $Q_{SS}$, present in the silicon dioxide layer 12, and also as a result of the positive gate voltage which turns the drift region 56 "on" to a greater degree when the short channel is biased "on". Also, as is known, when the silicon dioxide layer 12 is initially thermally grown over the surface of the silicon substrate 10, as discussed in connection with FIG. 1, and then cooled in an oxygen environment, positive charges are created in the silicon dioxide layer 12 to create a strong inversion in the contiguous high resistivity p-type conductivity silicon substrate 10 surface to form an n-type conductivity drift region 56.

Figure 10:
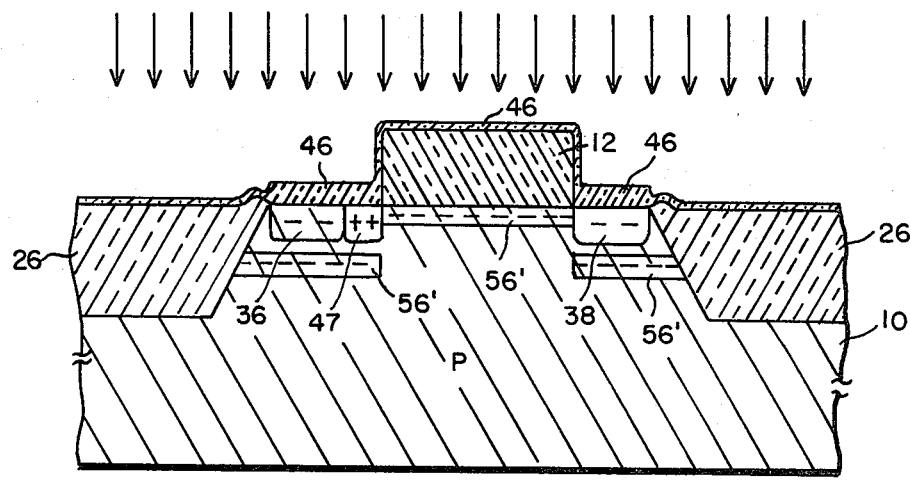
FIG. 10 is a cross-sectional elevation, diagrammatical view of a portion of the field effect device according to an alternative embodiment of the invention at an intermediate stage in the manufacture thereof.

Alternatively, the drift region 56 may be formed by ion implanting a suitable n-type dopant, as phosphorous atoms, into the surface of the structure either prior to or subsequent to the ion implantation of the boron atoms discussed in connection with FIG. 7. That is, referring to FIG. 10, after the thin silicon dioxide layer 46 is deposited over the surface of the structure phosphorous atoms are ion implanted into the silicon substrate 10 disposed beneath the silicon dioxide layer 12, as shown, to form, after annealing, the drift region 56'. The boron atoms are then ion implanted to form the gate region 47; however, the depth of such implanted boron atoms is less than the depth of the implanted phosphorous atoms and such implanted boron atoms do not enter the drift region 56'. Further, it should be noted that the implanted phosphorous atoms are disposed beneath the source, drain and gate regions 36, 38, 47 because the silicon dioxide layer 46 is thinner over such regions than the thick silicon dioxide layer 12 disposed over the drift region 56'. The phosphorous implant serves to reduce the impedance of the drift region 56' and may also serve to form a buried channel in the drift region 56' to reduce gate electrode capacitance. The structure is then processed as described in connection with FIGS. 8 and 9 to complete the MOS field effect device.

The length of the drift region 56 (or 56') may be adjusted to the desired circuit conditions and may range from about one micrometer to five micrometers. The drift region 56 (or 56') eliminates the short channel effects (i.e. punch through from drain to source and dependance of the gate threshold voltage on the drain voltage) which affect many short channel devices without much additional expenditure in wafer area. Further, the techniques described above enable the fabrication of devices suited for the relatively high voltage levels prevailing in many analog circuits and charge-coupled devices.

Having described preferred embodiments of this invention, it is evident that other embodiments incorporating these concepts may be used. For example, a relatively thin silicon nitride layer, 300-500 Å thick, may be formed between the metalization layer 54 and the silicon dioxide layer 46. Also, the drift region 56 may be formed by ion implanting phosphorous or arsenic atoms into the silicon substrate 10 prior to the formation of silicon dioxide layer 12 and silicon nitride layer 14. Still further, the source and drain electrodes S, D may be formed in a separate masking step than that used to form the gate electrode G. Also, the gate electrode G may be doped polycrystalline silicon, aluminum or a composite layer of titanium and aluminum. Further, the gate electrode G need not extend to the overlap of the drain region 38, but can terminate at one end over the silicon dioxide layer 12. Still further, while an n-channel device has been described, a p-channel device may be formed in analogous fashion by using dopants of opposite polarity. Also, the terms source and drain regions may be used interchangeably. It is felt, therefore, that this invention should not be restricted to the disclosed embodiments, but rather should be limited only by the spirit and scope of the appended claims.

What is claimed is:
1. A method of forming a semiconductor structure comprising the steps of:
(a) forming an insulating layer and a masking layer over a surface of the insulating layer, such insulating layer and masking layer covering a portion of a surface of a semiconductor having a first type conductivity, such insulating layer and masking layer masking such portion of the semiconductor;
(b) forming a region of opposite type conductivity in a portion of the semiconductor layer unmasked by the insulating layer and the masking layer;
(c) bringing a chemical etchant into contact with the insulating layer and the masking layer, selectively etching only side portions of the insulating layer, such masking layer inhibiting exposure of the surface of the insulating layer to the chemical etchant, reducing the area of the semiconductor masked by the insulating layer;
(d) ion implanting particles capable of establishing a first type conductivity in the semiconductor into a portion of the semiconductor exposed by the chemically etched insulating layer forming a region of first type conductivity contiguous to both the first formed region of opposite type conductivity and a region of the semiconductor masked by remaining portions of the chemically etched insulating layer; and (e) forming an electrode over remaining portions of the chemically etched insulating layer and over the portion of the semiconductor exposed by the chemically etched insulating layer and having formed therein the ion implanted region.

2. The method recited in claim 1 wherein the region of opposite type conductivity is formed by ion implantation.

3. A method of forming a field effect device comprising the steps of:
(a) forming an insulating layer and a masking layer over a surface of the insulating layer, such insulating layer and masking layer covering a portion of a surface of a semiconductor having a first type conductivity masking the underlying portion of such semiconductor and unmasking portions of the semiconductor adjacent to the insulating layer;
(b) introducing particles capable of forming an opposite type conductivity in the semiconductor into the unmasked portions of the semiconductor to form source and drain regions of the device;
(c) bringing a chemical etchant into contact with the insulating layer and the masking layer, selectively etching only side portions of the insulating layer, such masking layer inhibiting exposure of the surface of the insulating layer to the chemical etchant, reducing the area masked by the insulating layer, unmasking a gate region contiguous to the source region, and forming a drift region beneath the remaining portion of the insulating layer;
(d) introducing particles capable of establishing a region of first type conductivity in the semiconductor into the gate region exposed by the chemically etched insulating layer; and
(e) forming a gate electrode over the gate region and remaining portions of the insulating layer.

4. A method of forming a semiconductor structure comprising the steps of:
(a) forming an insulating layer and a masking layer over a portion of a surface of a semiconductor having a first type conductivity, such insulating layer being formed between the surface of the semiconductor and the masking layer, only such insulating layer being capable of being etched by a predetermined chemical etchant;
(b) forming a region of opposite type conductivity in a portion of the semiconductor exposed by the insulating layer and the masking layer;
(c) bringing the predetermined chemical etchant into contact with the insulating layer and the masking layer to reduce the area of the insulating layer masking the semiconductor, unmasking a second different portion of the semiconductor contiguous to the first masked portion of the semiconductor;
(d) ion implanting particles capable of establishing a region of first type of conductivity in the semiconductor selectively into the second different unmasked portion of the semiconductor to form a second region in the semiconductor contiguous to the first formed region, such chemically etched insulating layer inhibiting such particles from becoming implanted into the portion of the semiconductor disposed beneath the chemically etched insulating layer; and
(e) forming an electrode over the second, different unmasked portion of the semiconductor and over the unetched portion of the insulating layer.

5. The method recited in claim 4 including the step of forming a second, thinner insulating layer over the second formed region and wherein the electrode forming step includes the step of forming the electrode over the second, thinner insulating layer.

6. A method of forming a semiconductor structure comprising the steps of:
(a) forming an insulating layer and a masking layer over a surface of the insulating layer, such insulating layer and masking layer covering a portion of a surface of a semiconductor, masking such portion of the semiconductor;
(b) forming a first doped region in a portion of the semiconductor unmasked by the insulating layer and the masking layer;
(c) bringing a chemical etchant into contact with the insulating layer and the masking layer, selectively etching only side portions of the insulating layer, such masking layer inhibiting exposure of the surface of the insulating layer to the chemical etchant, reducing the area of the semiconductor masked by the insulating layer and unmasking a second, different portion of the semiconductor contiguous to the unmasked exposed portion of the semiconductor;
(d) introducing particles into the second, different unmasked portion of the semiconductor forming a second doped region in the semiconductor contiguous to the first doped region, the chemically etched insulating layer inhibiting such particles from becoming introduced into the portion of the semiconductor disposed beneath such insulating masking layer; and
(e) forming an electrode over remaining portions of the etched insulating layer and the unmasked second portion of the semiconductor having the second doped region.

7. A method for forming a semiconductor structure comprising the steps of:
(a) forming an insulator and a masking layer over a surface of the insulator, such insulator and masking layer covering a portion of a surface of a semiconductor structure;
(b) introducing particles into a first portion of the semiconductor structure exposed by the insulator and the masking layer;
(c) bringing a chemical etchant into contact with the insulator and the masking layer, selectively removing edge portions of the insulator exposed by the masking layer exposing a second, different portion of the semiconductor structure contiguous to the first portion;
(d) introducing particles into the second, different portion of the semiconductor structure, the remaining unetched portions of the chemically etched insulator inhibiting such particles from becoming introduced into the portion of the semiconductor structure disposed beneath remaining portions of the insulator; and
(e) forming an electrode over remaining portions of the insulator and over the second, different portion of the semiconductor exposed by the insulator.

* * * * *